United States Patent [19]

Mizutani

[11] Patent Number: 4,745,453
[45] Date of Patent: May 17, 1988

[54] SEMICONDUCTOR DEVICE

[75] Inventor: Yoshihisa Mizutani, Tokyo, Japan

[73] Assignee: Kabushiki Kaisha Toshiba, Kawasaki, Japan

[21] Appl. No.: 899,783

[22] Filed: Aug. 26, 1986

Related U.S. Application Data

[63] Continuation of Ser. No. 626,388, Jun. 29, 1984, abandoned.

[30] Foreign Application Priority Data

Jun. 30, 1983 [JP]   Japan ............................ 58-119348

[51] Int. Cl.$^4$ ............................................. H01L 27/02
[52] U.S. Cl. ....................................... 357/42; 357/68
[58] Field of Search ........................... 357/42, 43, 68

[56] References Cited

U.S. PATENT DOCUMENTS 4,528,581   7/1985   Lee ........................................ 357/23.11

FOREIGN PATENT DOCUMENTS 57-188863   11/1982   Japan ........................................ 357/42

OTHER PUBLICATIONS

IBM Technical Disclosure Bulletin, vol. 8, #12, pp. 1843–1844, May 1966.
IBM Technical Disclosure Bulletin, vol. 14, #6, Nov. 1971, p. 1682.
Patent Abstracts of Japan, E-79, 24, Oct. 1981.

Primary Examiner—Andrew J. James
Assistant Examiner—Mark Prenty
Attorney, Agent, or Firm—Finnegan, Henderson, Farabow, Garrett & Dunner

[57] ABSTRACT

A semiconductor device has P-type semiconductor body, a plurality of N-type wells formed in a surface area of the semiconductor body, and potential setting member for setting the potentials of the wells. This member has an N$^+$-type layer formed in the semiconductor body in contact with bottom surfaces of the wells, and an electrode formed on one of the wells.

9 Claims, 4 Drawing Sheets

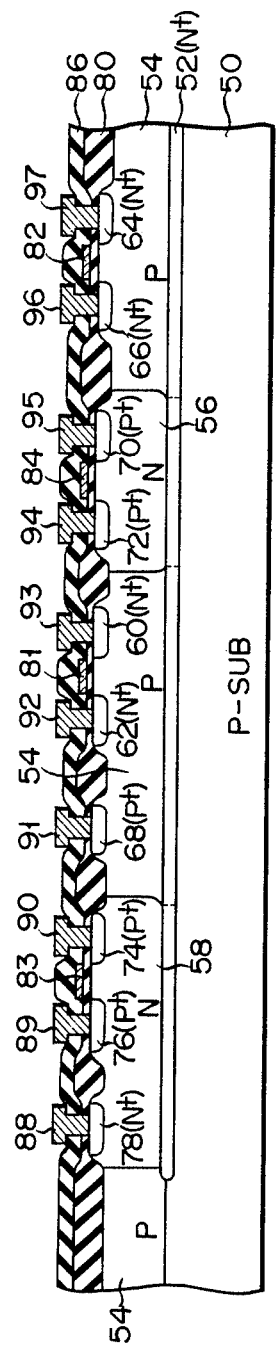
F I G. 3
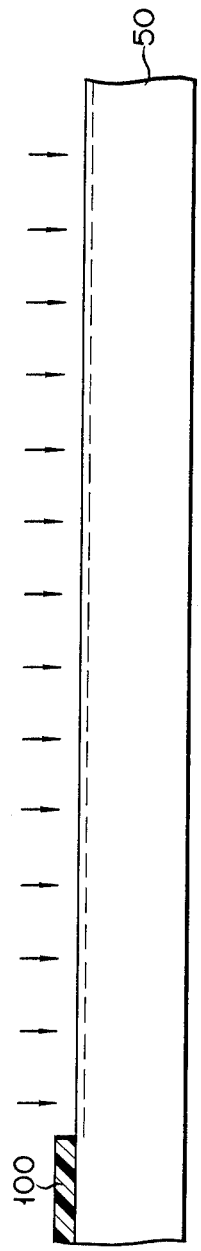
F I G. 4A
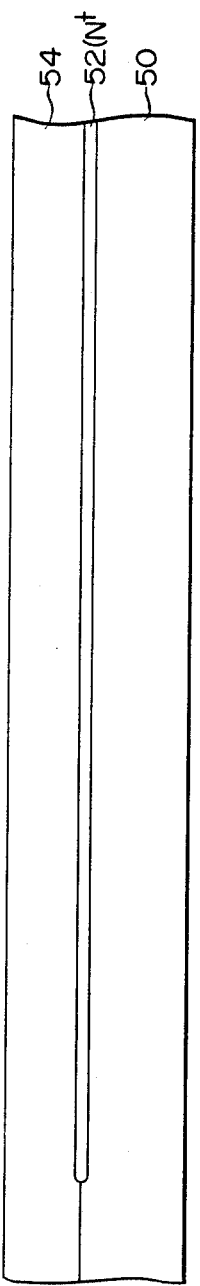
F I G. 4B

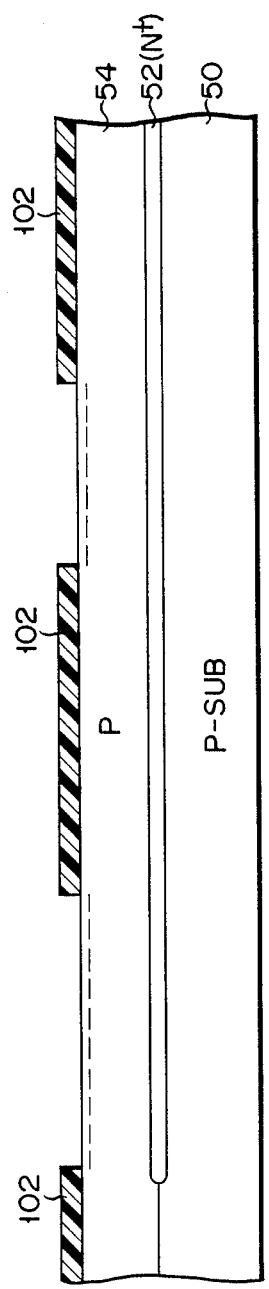
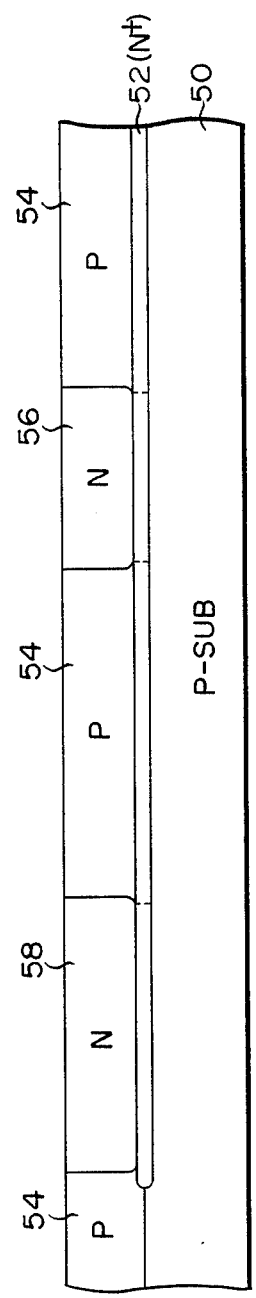

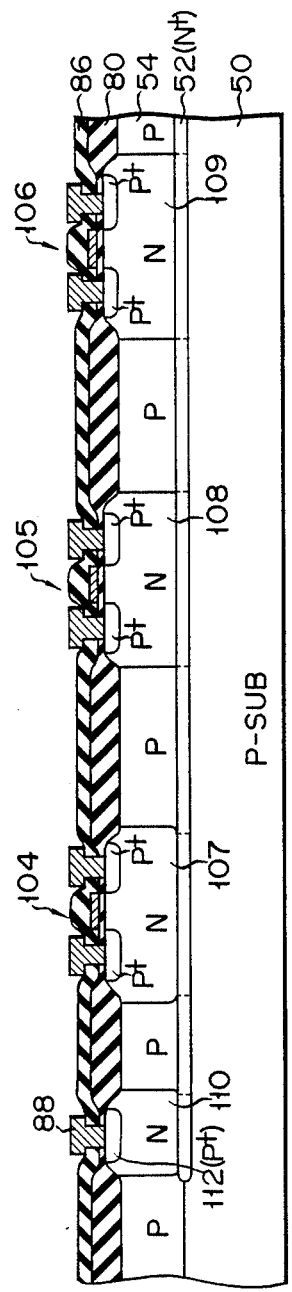
F I G. 5
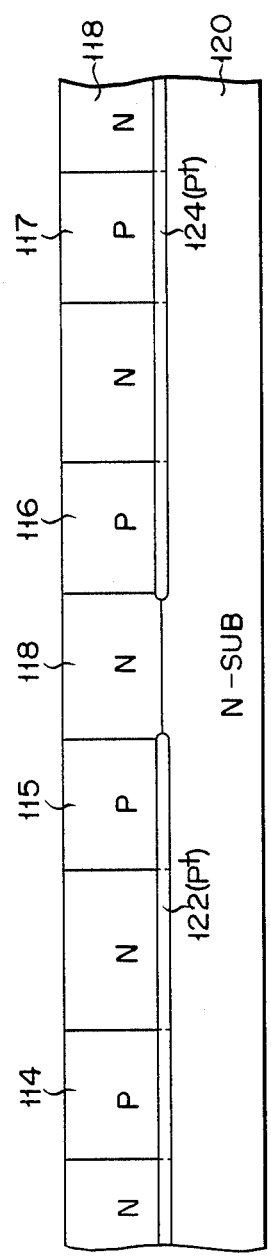
F I G. 6

SEMICONDUCTOR DEVICE

This application is a continuation, of application Ser. No. 06/626,388, filed June 29, 1984 and now abandoned.

BACKGROUND OF THE INVENTION

The present invention relates to a semiconductor device in which a plurality of wells of one conductivity type are provided in a semiconductor body of the opposite conductivity type.

P- and N-channel transistors are formed in a single semiconductor substrate to constitute an IC semiconductor device having, for example, CMOS circuits. In this case, if an N-channel transistor is formed in a surface area of, for example, a P-type silicon substrate, N-type wells for P-channel transistors must be formed in the surface area of the substrate.

FIG. 1 shows one of the CMOS circuits in an IC semiconductor device. An N-type well 12 is formed in a surface area of a P-type substrate 14 as described above. $N^+$-type regions 16 and 18 serving as a source and a drain of an N-channel transistor, respectively, and a $P^+$-type region 20 for setting the potential of the substrate 14 are formed in the surface area thereof. $P^+$-type regions 22 and 24 serving as a source and a drain of a P-channel transistor, respectively, are formed in a surface area of the N-type well 12. An $N^+$-type region 26 for setting the potential of the N-type well 12 is formed in its surface area. Then, the surface area of the substrate 14 including the well 12 is covered by an insulation layer 28, and a gate electrode 30 of the N-channel transistor is formed on that portion of the substrate 14 which lies between the regions 16 and 18. Subsequently, a gate electrode 32 of the P-channel transistor is formed on that portion of the well 12 which lies between the regions 22 and 24. An insulation layer 34 is formed on the insulation layer 28 to cover the gate electrodes 30 and 32. Electrodes 35 to 40 are respectively formed on the regions 20, 18, 16, 22, 24 and 26 through respective contact holes in the insulation layers 28 and 34, and are interconnected on the insulation layer 34 by a conductive pattern connected to another circuit (not shown). In such a structure, when a plurality of wells for P-channel transistors are formed in the substrate, electrodes for setting the potentials of these wells prevent the higher integration of the semiconductor elements, and a wiring pattern for interconnecting electrodes on the substrate becomes complex.

On the other hand, a P-channel transistor can be formed to have a structure shown in FIG. 2. In FIG. 2, an $N^+$-type region 26 is formed to be adjacent to a $P^+$-type region 24, and an electrode 44 is formed on the regions 24 and 26 in place of the electrodes 39 and 40 of FIG. 1. The same reference numerals as in FIG. 1 denote the same parts in FIG. 2. When P-channel transistors are formed in this manner, the number of electrodes can be reduced and higher integration can be achieved.

However, the potential of the electrode 44 must be maintained at a predetermined level. If the potential of the electrode 44 is changed to control characteristics such as a threshold voltage of a P-channel transistor in a CMOS circuit as shown in FIG. 2, the potential of the region 24 is also changed.

SUMMARY OF THE INVENTION

It is an object of the present invention to provide a semiconductor device in which a conductive pattern on a substrate surface area near a well can be simplified, and in which a well potential can be independently changed to control the characteristics of semiconductor elements in wells.

According to the present invention, there is provided a semiconductor device comprising a semiconductor body of one conductivity type, a plurality of wells of an opposite conductivity type which are formed in the surface area of the semiconductor body, and in which a semiconductor element is formed, and at least one layer of the opposite conductivity type which is formed in the semiconductor body in contact with the plurality of the wells.

According to a semiconductor device of the present invention, the number of electrodes on a semiconductor body can be reduced and higher integration can be achieved. Furthermore, the characteristics of the semiconductor elements formed in the wells can be independently changed without affecting other elements.

BRIEF DESCRIPTION OF THE DRAWINGS

FIG. 3 is a cross-sectional view of a semiconductor device according to an embodiment of the present invention;

FIGS. 4A to 4D are respectively views for explaining a manufacturing method of the semiconductor device of FIG. 3; and FIGS. 5 and 6 are views showing a semiconductor device according to another embodiment of the present invention.

DETAILED DESCRIPTION OF THE PREFERRED EMBODIMENTS

Figure 1:
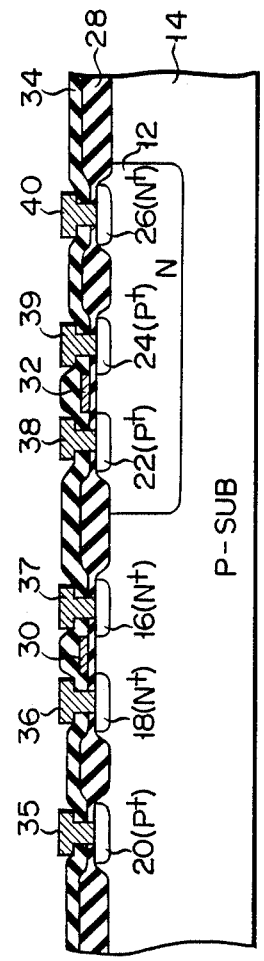
FIG. 1 is a cross-sectional view of a conventional CMOS circuit.
Figure 2:
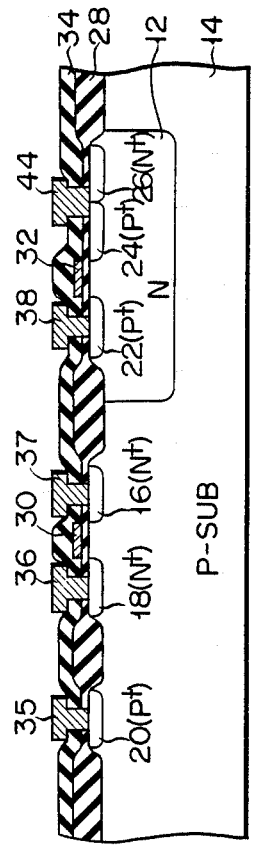
FIG. 2 is a cross-sectional view of a conventional CMOS circuit having a structure different from that of FIG. 1.

A semiconductor device according to the present invention will now be described with reference to FIG. 3. The semiconductor device includes a P-type substrate 50 and an $N^+$-type region 52 patterned in a surface area of the substrate 50. The semiconductor device also includes a P-type layer 54 for forming N-channel transistors as first circuit elements in the surface area of the substrate 50 and N-type regions 56 and 58 for forming P-channel transistors as second circuit elements in the surface area of the substrate 50. The layer 54 is formed on the substrate 50 and the region 52, and the regions 56 and 58 are formed in the layer 54 in contact with the region 52. Then, $N^+$-type regions 60, 62, 64 and 66 are respectively formed in a surface area of the layer 54 to serve as sources and drains of the first and second P-channel transistors. $P^+$-type regions 70, 72 and $P^+$-type regions 74, 76 are formed in the respective surface areas of the regions 56 and 58 to serve as sources and drains of the first and second N-channel transistors. A $P^+$-type region 68 is formed in the surface area of the layer 54 to set the potentials of the substrate 50 and the layer 54 at a predetermined bias level. An $N^+$-type region 78 is formed in a surface area of the region 58 to set the potential of the region 56 through the regions 58 and 52. An insulation layer 80 is formed on the layer 54 including the regions 56 and 58. Gate electrodes 81 and 82 of the first and second P-channel transistors are respectively formed on that portions of the layer 54 which lie between regions 60 and 62 and between regions 64 and 66. Gate electrodes 83 and 84 of the first and second N-channel transistors are respectively formed on that portion of the layer 58 which lies between regions 74 and 76, and on that portion of the layer 56 which lies between the regions 70 and 72. The gate electrodes 81 to 84 and the insulation layer 80 are covered by another insulation layer 86. Electrodes 88 to 97 are respectively formed on the regions 78, 76, 74, 68, 62, 60, 72, 70, 66 and 64 through respective contact holes. The electrodes 88 to 97 are selectively interconnected by a conductive pattern (not shown) formed on the layer 86. Note that portions of the layer 54 under the N-channel transistors are formed in contact with the substrate 50.

The semiconductor device of FIG. 3 is manufactured in the following manner. First, a resist pattern 100 is formed on a substrate 50, and an N-type impurity such as antimony of a dose of about $2 \times 10^{15}/cm^2$ is ion-implanted in the substrate 50 at an energy of 20 to 40 keV using the resist pattern 100 as a mask. In this case, the antimony is distributed in the surface area of the silicon substrate 50, as shown in FIG. 4A. After removing the resist pattern 100, the substrate 50 is exposed to an atmosphere containing a P-type impurity such as boron, and is subjected to epitaxial growth to form a P-type region 54 of a thickness of e.g., 3 μm. During the epitaxial growth, the substrate 50 is heated to a temperature of about 1,000° C., and therefore the antimony is activated to form an N+-type region 52 of about 1 μm thickness, as shown in FIG. 4B.

Next, a resist pattern 102 corresponding to N-type wells 56 and 58 of FIG. 3 is formed on the layer 54, as shown in FIG. 4C. Then, an N-type impurity such as phosphorus of a dose of $1 \times 10^{12}/cm^2$ is doped in the P-type layer 54 at an energy of 80 keV using the resist pattern 102 as a mask. After removing the resist pattern 102, the substrate 50 is exposed to a nitrogen atmosphere at a temperature of about 1,000° C. for about 6 hours. As a result, the N-type wells 56 and 58 shown in FIG. 4D are formed in the layer 54 in good contact with the region 52.

Furthermore, P- and N-channel transistors are formed by a conventional manufacturing method in the wells 58 and 56 and the layer 54, respectively. In other words, an insulation layer 80 is formed by thermal oxidation of the layer 54 and the wells 56 and 58. Subsequently, gate electrodes 81 to 84 are respectively formed at predetermined positions by patterning an electrode material such as phosphorus-doped polycrystalline silicon. Boron and phosphorus are respectively ion-implanted in the N-type wells 56 and 58 and the P-type layer 54 using the gate electrodes 81 to 84 and the insulation layer 80 as a mask. There ion-inplantated surface areas of the wells 56 and 58 and the layer 54 are activated to form regions respectively serving as sources and drains of the P- and N-channel transistors. Subsequently, a silicon oxide film is deposited by a CVD method on the insulation layer 80 to form an insulation layer 86. Contact holes are respectively formed in the insulation layers 80 and 86, and thereafter an aluminum film is deposited on the regions 60, 62, 64, 66, 68, 70, 72, 74, 76 and 78 to form electrodes 88 to 97.

According to the semiconductor device of this embodiment, the N-type well 58 is connected to the N-type well 56 through the N+-type region 52, so that the same potential as that of the electrode 88 can be set in the wells 56 and 58. Generally, when a plurality of N-type wells is formed in the layer 54, if the bias potential is set in at least one of these wells, the potentials of the other wells can be set, for example, through the N+-type region 52 in contact with bottom surfaces thereof. Unlike the conventional case, in the present invention, it is not necessary to provide a plurality of electrodes for setting the bias potential in each well and to interconnect them on the insulation layer 86. Therefore, the conductive pattern on the insulation layer 86 can be simplified. In particular, as shown in FIG. 3, when an N-channel transistor must be formed on a portion between the first and second P-channel transistors, and the first and second P-channel transistors cannot be formed in a single well, the N+-type region 52 serves to set the same potential in the respective wells.

In addition, in this embodiment, source and drain electrodes of P- and N-channel transistors and an electrode for setting the potential of a well are separately provided, so that characteristics of these transistors such as the threshold voltage can be independently controlled without affecting the source and drain voltages thereof.

Although N-type transistors are formed on the P-type layer 54 in this embodiment, they may be omitted, as shown in FIG. 5. In FIG. 5, the same reference numerals are used to identify the same parts as in FIG. 3. A semiconductor device of FIG. 5 has three P-channel transistors 104 to 106 having the same structure as those in FIG. 3. These P-channel transistors are respectively formed on N-type wells 107 to 109 formed in a P-type layer 54. Furthermore, the semiconductor device has an N-type well 110 in the layer 54, and an electrode 88 is interconnected to an N+-type region 112 formed in the N-type well 110. Then, an N+-type region 52 is formed in contact with bottom surfaces of the wells 107 to 109. In the device modified in such a manner, the same effect as the embodiment of FIG. 3 can be obtained.

In each embodiment described above, although a plurality of wells is interconnected in a semiconductor body through a single region of one conductivity type, modifications can be made such that these wells are connected through two or more regions of the same conductivity type.

A semiconductor device of FIG. 6 is provided with P-type wells 114 to 117 for forming N-channel transistors in the surface areas thereof. The P-type wells 114 to 117 are formed in an N-type layer 118 formed on an N-type substrate 120. A first P+-type region 122 is formed on the substrate 120 in contact with the bottom surfaces of the wells 116 and 117. According to the semiconductor device of FIG. 6, if electrodes are formed on the wells 114 and 117, for example, the potentials of the wells 115 and 116 can be set at the same level as those of the wells 114 and 117, respectively. For example, when N-channel transistors are formed on the wells 115 and 116, respectively, and different potentials are respectively set in the electrodes on the wells 114 and 117, an N-channel transistor on the well 115 and an N-channel transistor on the well 116 can have different characteristics such as different threshold values.

In the embodiments described above, a semiconductor body comprises a silicon substrate and a silicon layer formed thereon by epitaxial growth. However, this semiconductor body can be constituted only of a silicon substrate and various semiconductor elements such as a MOS transistor can be formed therein.

What is claimed is:

1. A semiconductor device comprising:
a semiconductor body of one conductivity type;
a plurality of wells of an opposite conductivity type formed in the surface area of said semiconductor body;
a plurality of groups of MIS transistors, each of said transistors having source and drain regions formed in the surface area of one of said wells;
a plurality of embedded layers of the opposite conductivity type each being associated with the wells of one of said groups and each formed in contact with those ones of said wells which contain the associated group of said MIS transistors, each of said embedded layers having a higher impurity concentration than the associated wells, said embedded layers being separated from the surface of said semiconductor body by a predetermined distance, and each of said wells being in contact with the upper surface of the associated embedded layer;
a plurality of electrode means for causing one group of said MIS transistors to have different characteristics from another group of said MIS transistors, each of said electrode means being respectively connected to a different one of said embedded layers, said electrode means being selectively set at different potentials from each other; and
a plurality of second MIS transistors each of which has source and drain regions formed in the surface area of said semiconductor body and which have a complementary relationship with the first MIS transistors, at least one of said second MIS transistors being positioned above one of said embedded layers between two of said wells containing first MIS transistors of one of said groups.

2. A semiconductor silicon device according to claim 1, wherein said semiconductor body includes a silicon substrate and an epitaxial silicon layer formed on said silicon substrate.

3. A semiconductor device according to claim 2, wherein said wells are formed in said epitaxial silicon layer, and said embedded layers are formed between said silicon substrate and said epitaxial silicon layer.

4. A semiconductor device according to claim 1, wherein said semiconductor body is formed of a P-type semiconductor, and each of said wells is formed of an N-type semiconductor.

5. A semiconductor device according to claim 4, wherein said MIS transistors are of a P-channel type.

6. A semiconductor device according to claim 1, wherein said semiconductor body is formed of an N-type semiconductor, and said wells are formed of P-type semiconductor.

7. A semiconductor device according to claim 1, wherein at least one of said electrode means includes a contact well of the opposite conductivity type formed in the surface area of said semiconductor body in contact with one of said embedded layers, and an electrode connected to said contact well.

8. A semiconductor device according to claim 7, wherein said at least one of the electrode means further includes a contact region of the opposite conductivity type formed in the surface area of said contact well in contact with said electrode, said contact region having an impurity concentration higher than that of said contact well.

9. A semiconductor device according to claim 1, wherein at least one of said electrode means includes a contact region of the opposite conductivity type formed in the surface area of one of the associated wells and having an impurity concentration higher than that of said associated wells, and an electrode formed on said contact region.

* * * * *